(12) United States Patent
Osenbach et al.

(10) Patent No.: US 7,408,246 B2
(45) Date of Patent: *Aug. 5, 2008

(54) CONTROLLING WARPING IN INTEGRATED CIRCUIT DEVICES

(75) Inventors: John W. Osenbach, Kutztown, PA (US); Thomas H. Shilling, Macungie, PA (US); Weidong Xie, Orefield, PA (US)

(73) Assignee: Agere Systems, Inc., Allentown, PA (US)

( * ) Notice: Subject to any disclaimer, the term of this patent is extended or adjusted under 35 U.S.C. 154(b) by 253 days.

This patent is subject to a terminal disclaimer.

(21) Appl. No.: 11/095,929

(22) Filed: Mar. 31, 2005

(65) Prior Publication Data

US 2006/0220194 A1 Oct. 5, 2006

(51) Int. Cl.
*H01L 23/495* (2006.01)

(52) U.S. Cl. .............................. 257/669; 257/E23.045

(58) Field of Classification Search .................. 257/669, 257/E23.045
See application file for complete search history.

(56) References Cited

U.S. PATENT DOCUMENTS

| 7,084,489 | B2* | 8/2006 | Thurgood | 257/669 |
| 7,164,200 | B2* | 1/2007 | Brennan et al. | 257/707 |
| 2005/0189616 | A1* | 9/2005 | Brennan et al. | 257/550 |

* cited by examiner

*Primary Examiner*—David A Zarneke
*Assistant Examiner*—Jenny L Wagner
(74) *Attorney, Agent, or Firm*—Ryan, Mason & Lewis, LLP

(57) ABSTRACT

Techniques for integrated circuit device fabrication are provided. In one aspect, an integrated circuit device comprises a base, at least one die attached to the base, and a counterbalancing layer on at least a portion of at least one side of the base adapted to compensate for at least a portion of a thermal expansion difference existing between the base and the die. In another aspect, warping of an integrated circuit device comprising at least one die attached to a base is controlled by applying a counterbalancing layer to at least a portion of at least one side of the base adapted to compensate for at least a portion of a thermal expansion difference existing between the base and the die.

16 Claims, 7 Drawing Sheets

| MATERIAL | CTE (ppm/°C) | MODULUS (GPa) | THICKNESS |
|---|---|---|---|
| Si | 3 | 150 | 2mil |
| Cu | 16.9 | 120 | 50mil |
| Ni | 13.1 | 225 | 2.5 – 8μm |

| Ni LAYER THICKNESS | | TIP DEFLECTION (mil) | REDUCTION |
|---|---|---|---|
| μm | μ-INCH (x10³) | | |
| 100 | 3.94 | 1.1 | −159.5% |
| 50 | 1.97 | −0.3 | −82.6% |
| 10 | 0.39 | −1.8 | −10.3% |
| 5 | 0.20 | −2.0 | −9.6% |
| 0 | 0.00 | −2.2 | |

CONTROLLING WARPING IN INTEGRATED CIRCUIT DEVICES

FIELD OF THE INVENTION

The present invention relates generally to integrated circuit devices, such as power transistor devices, and more particularly to techniques for controlling warping in such devices.

BACKGROUND OF THE INVENTION

Metal oxide semiconductor (MOS) power transistor devices have gained popularity in certain applications for their high power capabilities. There are various types of MOS power transistor devices, including diffused metal oxide semiconductor (DMOS) devices, such as lateral DMOS (LD-MOS) devices, vertical DMOS devices and trench DMOS devices.

A MOS power transistor device may comprise one or more transistor dies mounted on a base. The die(s), base and potentially other components of the transistor device may be contained, at least partially, in a package. For example, the base is typically surrounded by polymer or ceramic walls that form cavity sidewalls of the package. A polymer or ceramic lid is then placed on top of the sidewalls. These "packaged" components are referred to herein collectively as a device package. The base, which typically comprises the bottom of the device package, may be mounted on a heat sink to remove heat from the device package during operation.

A method commonly used to mount the die on the base is soldering. During soldering, however, elevated temperatures are experienced causing both the die and the base to expand. The die and the base typically comprise different materials, and therefore expand by different magnitudes. For example, dies typically comprise silicon which, when heated, will expand by a lesser magnitude than the base, which typically comprises copper, or some alloy thereof. This differential expansion and its associated contraction, e.g., during cooling, can cause warping of the base.

Warping of the base is undesirable. For example, depending on the amount of warping that occurs, the device package may not be suitable for attachment to the heat sink. Specifically, attaching a warped base to a heat sink can result in voids, or gaps, being present between the base and the heat sink. These voids can serve as an impediment to the thermal path between the device package and the heat sink, and thus can lead to overheating of the device.

Therefore, techniques for minimizing or eliminating warping in power transistor devices, and other types of integrated circuit devices, would be desirable.

SUMMARY OF THE INVENTION

Techniques for integrated circuit device fabrication are provided. In one aspect of the invention, an integrated circuit device comprises a base, at least one die attached to the base, and a counterbalancing layer on at least a portion of at least one side of the base adapted to compensate for at least a portion of a thermal expansion difference existing between the base and the die.

In another aspect of the invention, warping of an integrated circuit device comprising at least one die attached to a base is controlled by applying a counterbalancing layer to at least a portion of at least one side of the base adapted to compensate for at least a portion of a thermal expansion difference existing between the base and the die.

In an illustrative embodiment, an integrated circuit device includes a counterbalancing layer comprising nickel (Ni) deposited on a side of a base opposite one or more silicon (Si) dies. The counterbalancing layer compensates for differential expansion and contraction between the base and the Si dies by itself expanding and contracting in a manner that cancels out at least a portion of the differential expansion and contraction of the Si dies and the base.

Advantageously, the invention in the illustrative embodiment prevents most, if not all, of the warping of the base, resulting in a flat or substantially flat surface for attachment of the integrated circuit device to a heat sink.

DETAILED DESCRIPTION

Figure 1:
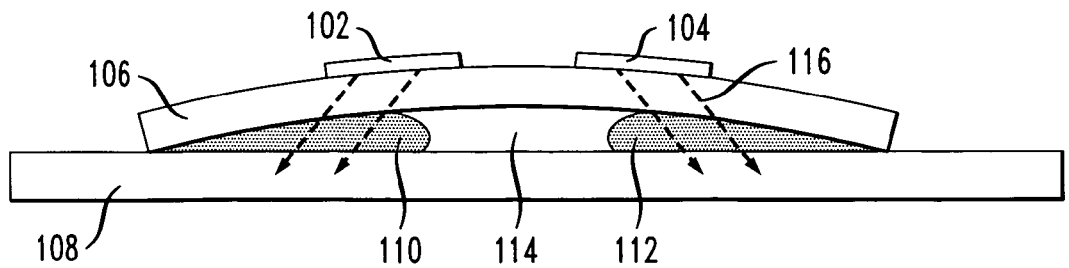
FIG. 1 is a diagram illustrating a conventional power transistor device mounted on a heat sink.

Before describing the inventive aspects of the present invention, a conventional power transistor device is described. For example, as shown in FIG. 1, a conventional power transistor device comprises silicon (Si) dies 102 and 104 mounted on, e.g., by soldering, base 106, which typically comprises a metal. The power transistor device is soldered onto metal heat sink 108, e.g., at solder regions 110 and 112.

Because silicon dies 102 and 104 have a different composition (e.g., comprise different materials) from base 106 (and potentially from each other) they will have different coefficients of thermal expansion (CTE) and thus will expand a different amount than base 106 when exposed to the heat generated during solder attachment to base 106. This differential thermal expansion and its associated contraction (e.g., during cooling) will cause base 106 to warp. Specifically, to liquefy the solder, depending on the solder composition, temperatures as high as about 400° C. may be employed. These elevated temperatures cause silicon dies 102 and 104, and base 106 to expand. Once the solder melts, the temperature is then reduced to allow the solder to re-solidify and form a bond. Typical gold/tin (Au/Sn) solders begin to re-solidify around 320° C. Thus, at this temperature, Si dies 102 and 104 become fixed to base 106 (e.g., by the re-solidified solder). Also, at this temperature, Si dies 102 and 104 and base 106 have expanded by different amounts, however, their positions, relative to one another, are now fixed by the solidified solder. As the device further continues to cool, e.g., to room temperature, Si dies 102 and 104, and base 106, will begin to contract. Since, Si dies 102 and 104, and base 106 will contract by an amount proportional to their expansion, Si dies 102 and 104 and base 106 will contract by different amounts. With their positions relative to one another being fixed, this differential contraction can cause base 106 to warp, as shown.

Attaching a warped power transistor device to a heat sink, for example as shown in FIG. 1, will result in void(s), e.g., void 114, being formed. These voids trap air which acts as an impediment to thermal flow. Specifically, the thermal path, e.g., illustrated by arrows 116, will be constrained to areas where the solder forms a continuous bond between base 106 and metal heat sink 108 and insufficient cooling may result. Insufficient cooling can lead to overheating of the power transistor device.

Figure 2:
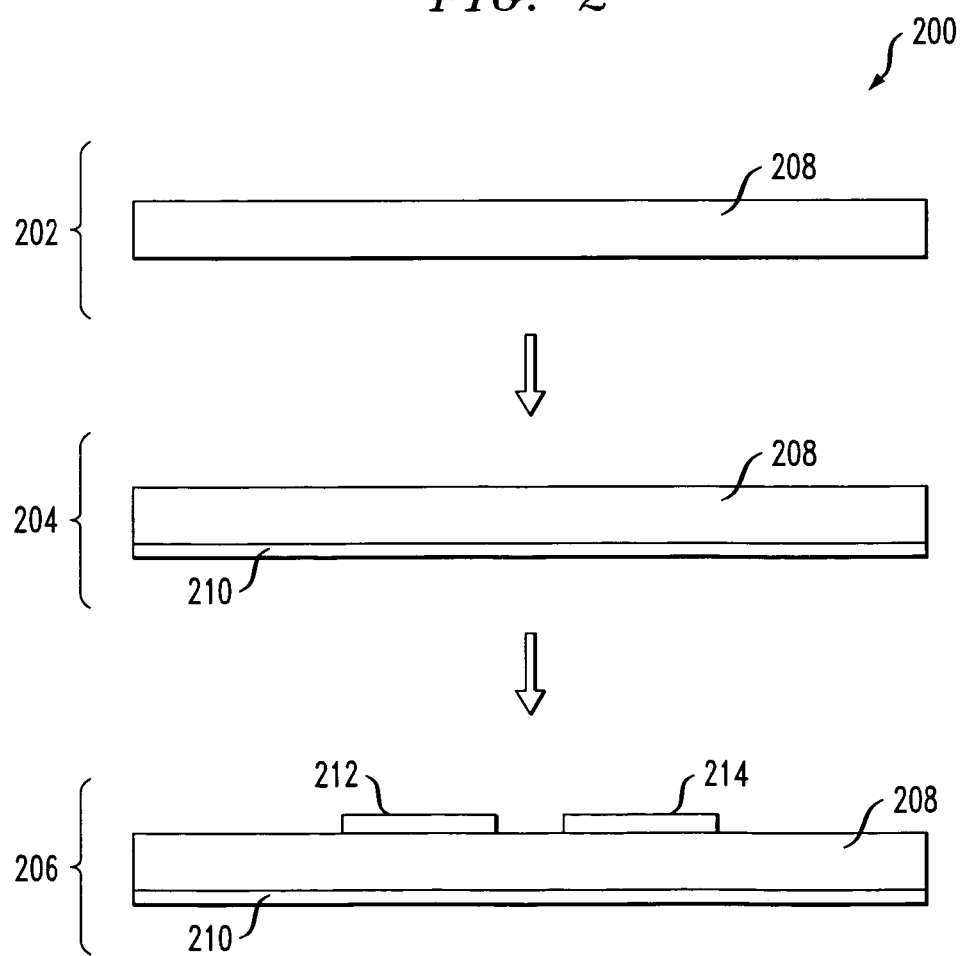
FIG. 2 is a diagram illustrating an exemplary methodology for controlling warping of a power transistor device.

In FIG. 2, exemplary methodology 200 for controlling warping of a power transistor device is presented. In step 202, base 208 is provided. Base 208 may comprise any suitable materials, including, but not limited to, metals, such as copper (Cu) and alloys thereof, for example, Cu/tungsten (Cu/W) alloys, and non-metals, such as silicon carbide (SiC), aluminum nitride (AlN) and chemical vapor deposited (CVD) diamond. According to an exemplary embodiment, as will be described in detail below, base 208 may have a thickness of about 50 mils to about 70 mils.

According to an exemplary embodiment, base 208 is produced from a sheet using standard processing techniques. For example, base 208 may be stamped from a large Cu or Cu alloy sheet. Such a stamping process would typically result in the base produced being flat or substantially flat, e.g., any deviations from planarity being less than or equal to about one mil. For example, when placed on a flat surface, any raise of the edges from the flat surface would be less than or equal to about one mil.

In step 204, counterbalancing layer 210 is deposited on one side of base 208. Counterbalancing layer 210 acts as a warp compensating layer, e.g., compensating the differential expansion and contraction between base 208 and dies 212 and 214, see step 206, below, which, if left uncompensated, may result in warping of base 208.

Counterbalancing layer 210 may comprise any suitable material, including, but not limited to, metals, such as nickel (Ni), molybdenum (Mo), titanium (Ti), chromium (Cr), tungsten (W) and combinations comprising at least one of the foregoing metals. By way of example only, counterbalancing layer 210 may be deposited on base 208 using any suitable deposition techniques, including, but not limited to, electrochemical plating techniques, CVD, sputtering, electron-beam (e-beam) deposition and plasma enhanced deposition. Further, as shown in FIG. 2, counterbalancing layer 210 is preferably deposited on a single side of base 208. Also, techniques other than deposition may be used to form a counterbalancing layer in accordance with the invention.

Counterbalancing layer 210 compensates for the differential expansion and contraction between base 208 and dies 212 and 214 by itself expanding and contracting in a manner that cancels out at least a portion of the differential expansion and contraction of the dies and base. For example, according to an exemplary embodiment, counterbalancing layer 210 is in a fixed position relative to base 208 and opposite the dies (which are also in a fixed position relative to base 208, see description of step 206, below). Counterbalancing layer 210 will thus heat up, e.g., during soldering of the dies to base 208, and expand and subsequently contract concurrently with base 208 and the dies. The coordinated expansion and contraction of these interrelated layers can act to prevent warping of the device. The relative expansion of some exemplary materials will be described in detail below. As will also be described in detail below, the thickness and configuration of the counterbalancing layer may be varied to tune its compensating properties.

According to an exemplary embodiment, counterbalancing layer 210 is a continuous layer, extending over a substantial portion of at least one surface of base 208. Counterbalancing layer 210 does not, however, have to be continuous. By way of example only, counterbalancing layer 210 may comprise a segmented layer, e.g., having perforations or other openings or indentations extending through at least a portion of the thickness of the layer. According to an exemplary embodiment, counterbalancing layer 210 comprises a segmented layer having indentations on one or more surfaces thereof. According to another exemplary embodiment, counterbalancing layer 210 comprises a segmented layer with perforations extending through the entire thickness of the layer, the length of each segment running parallel with the direction of warping. See FIG. 3, below. Also, counterbalancing layer 210 may comprise a hatched layer. See FIG. 4, below.

Further, as will be described, for example, in conjunction with the description of FIG. 6, below, the thickness of counterbalancing layer 210 may be varied to tune its compensating properties.

In step 206, dies 212 and 214 are soldered onto a side of base 208 opposite counterbalancing layer 210. As shown in FIG. 2, dies 212 and 214 are attached to a side of base 208 opposite counterbalancing layer 210.

Dies 212 and 214 each may comprise any suitable materials, including, but not limited to, one or more of Si, indium phosphide (InP), indium gallium phosphide (InGaP), indium gallium arsenide phosphide (InGaAsP), gallium arsenide (GaAs), silicon carbide (SiC), silica germanium (SiGe), indium tin oxide (InSnO), black diamond, crystallized carbon, polymeric semiconductor and lithium niobate (LiNbO$_3$). Further, dies 212 and 214 may comprise the same, or different, materials from each other. In one exemplary embodiment, both dies 212 and 214 comprise Si.

Figure 3:
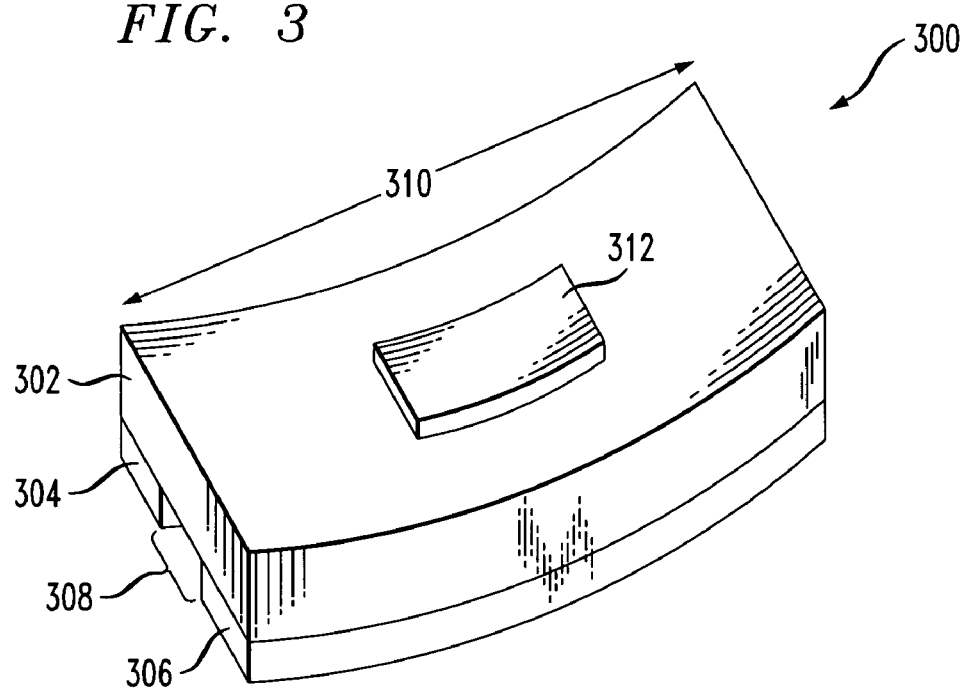
FIG. 3 is a diagram illustrating an exemplary power transistor device having a segmented counterbalancing layer.

As highlighted above, counterbalancing layer 210 may be segmented. In FIG. 3, power transistor device 300 having a segmented counterbalancing layer is shown. Power transistor device 300 comprises base 302 having die 312 on a side thereof. Base 302 also has counterbalancing layer segments 304 and 306 (having perforation 308 therebetween) on a side opposite die 312.

According to the configuration shown in FIG. 3, counterbalancing layer segments 304 and 306 run in the same direction as, e.g., are parallel to, the direction of the warping of base 302. It is important to note that the warping of base 302 is shown exaggerated, primarily to illustrate an exemplary direction of warping 310. However, according to the teachings presented herein, some, or all, of the warping of base 302 will be prevented by counterbalancing layer segments 304 and 306, and thus would be barely, if at all, visible.

It is also to be understood that depending on the configuration of the power transistor device, warping may occur in more than one direction. By way of example only, if the power transistor device is configured to have one side longer than the other, e.g., making it long and narrow, then warping may occur predominately in one direction, for example, as shown in FIG. 3. However, if the power transistor device is configured to have sides that are equal, or near equal, in length to each other, then warping may occur in more than one direction, for example, as shown in FIG. 4.

Figure 4:
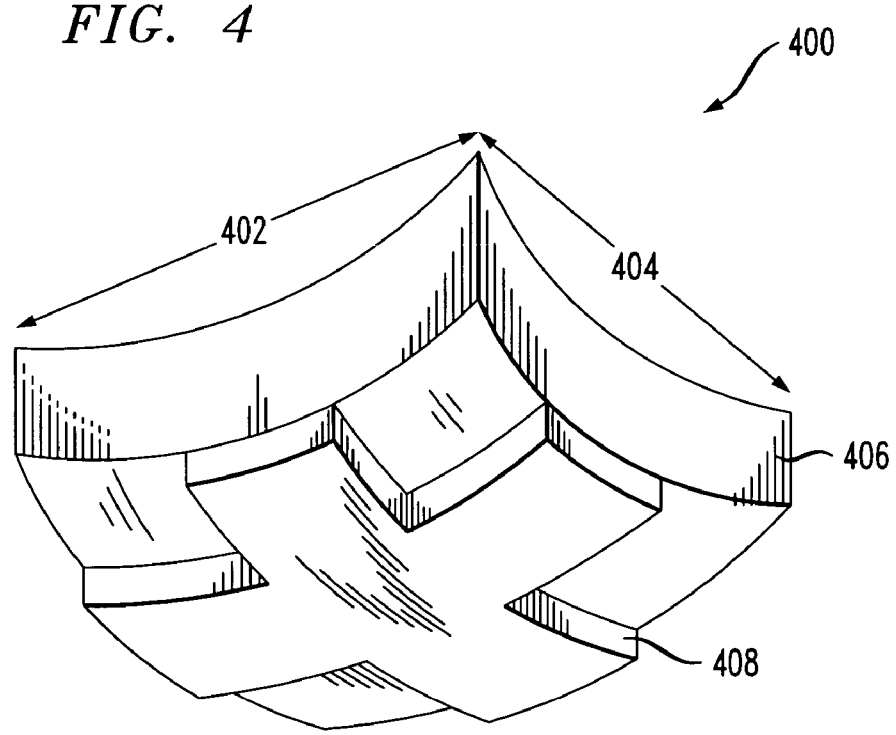
FIG. 4 is a diagram illustrating an exemplary power transistor device having a hatched counterbalancing layer.

In FIG. 4, power transistor device 400 is configured to have sides that are equal, or near equal, in length to each other. As a result, warping occurs in more than one direction, e.g., direction of warping 402 and direction of warping 404. In FIG. 4, power transistor device 400 comprises base 406 having hatched counterbalancing layer 408 on a side thereof, e.g., on a side opposite one or more dies (not visible from the angle shown). Hatched counterbalancing layer 408, while not a continuous layer, can serve to counterbalance both directions of warping 402 and 404.

It should be noted that the counterbalancing layer configurations shown in FIGS. 3 and 4 are merely exemplary, and the teachings herein should not be limited to these, or any other, particular configurations.

As above, the warping of base 406 is shown exaggerated, primarily to illustrate exemplary directions of warping 402 and 404. However, according to the teachings presented herein, some, or all, of the warping of base 406 will be prevented by hatched counterbalancing layer 408, and thus would be barely, if at all, visible.

Figures 5, 6, 7:
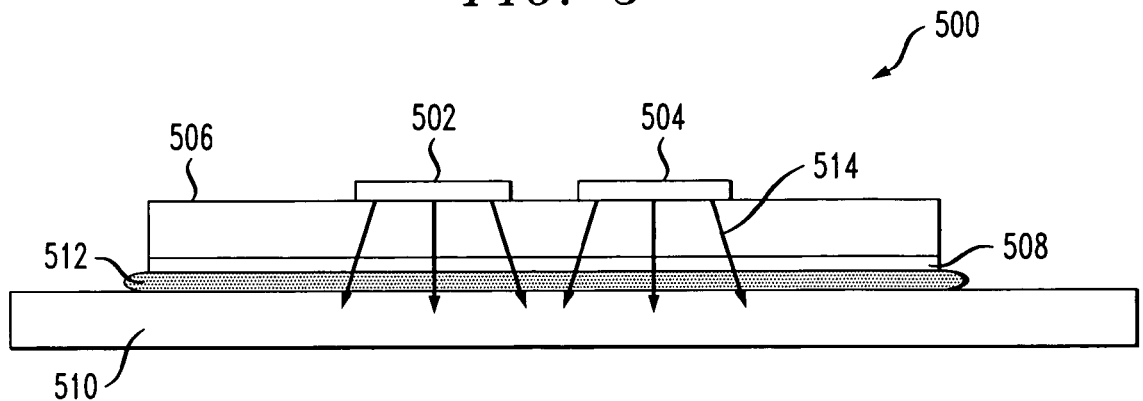
FIG. 5 is a diagram illustrating an exemplary power transistor device, having a counterbalancing layer, soldered to a heat sink.
FIG. 6 is a table displaying properties of several materials used in power transistor devices.
FIG. 7 is a table displaying amounts of warping experienced by a base having either a nickel (Ni) layer present at various thicknesses, or no Ni layer at all.

In FIG. 5, a power transistor device 500 having a counterbalancing layer 508 is shown soldered to a heat sink, e.g., heat sink 510. The power transistor device 500, similar to the power transistor device 200 described in conjunction with the description of FIG. 2, above, comprises base 506 having Si dies 502 and 504 mounted thereon and counterbalancing layer 508 on a side of base 506 opposite the dies. The power transistor device is attached to metal heat sink 510 by solder layer 512. It is important to note from FIG. 5 that, since base 506 is flat, a continuous bond via solder layer 512 is formed with heat sink 510. As such, no voids are present. Therefore, an uninterrupted thermal path, e.g., as indicated by arrows 514, between silicon dies 502 and 504, and heat sink 510 is created.

FIG. 6 is a table displaying coefficient of thermal expansion (CTE), modulus of elasticity (modulus) and thickness values for Si, e.g., die material, Cu, e.g., base material, and Ni, e.g., counterbalancing layer material.

It should be noted from the table, that the CTE for Cu, e.g., 16.9 parts per million per ° C. (ppm/° C.), is greater than five times that for Si, e.g., three ppm/° C. This expansion differential is what, when not counteracted, causes warping of the device. The CTE for Ni, e.g., 13.1 ppm/° C., however, is on the same order of magnitude, but less than that of the Cu. As a result, the Ni layer will expand an amount similar to, yet less than, the Cu. The differential expansion (and subsequent contraction) of each of these three interrelated layers, at least in part, cancel each other out, and maintain the base in a flat, or substantially flat state.

The modulus, or modulus of elasticity, values define the ratio of stress to strain for each of the materials (measured in gigapascals (GPa)). The modulus of elasticity is basically an index of the "stiffness" of a material, e.g., how easily does it bend. Modulus of elasticity values may be obtained, for example, from materials suppliers, as will be appreciated by those skilled in the art.

In the table of FIG. 6, the CTE and modulus of elasticity data are presented for certain thicknesses of the three materials. For example, data is given for Si at a thickness of two mils, for Cu at a thickness of 50 mils and for Ni at a thickness of 2.5 micrometers (μm) to 8 μm.

FIG. 7 is a table displaying tip deflection values (in mils) and reduction values of a base having a continuous Ni layer present at various thicknesses, or no Ni layer present at all. Thickness values are presented both in μm and in microinches (μ-inches).

The tip deflection values provide a measure of deviations from planarity of the base and can thus be used to represent the magnitude of the deformation experienced in the base. The reduction (e.g., reduction in warping) values provide a measure of the tip deflection value for a base having a Ni layer of a particular thickness as compared to a base without any Ni layer. For example, by applying a Ni layer having a thickness of 50 μm to a base, an 82.6 percent reduction in warping, as compared to a similar base without a Ni layer, is experienced (e.g., a reduction value of −82.6 percent). Therefore, the reduction value provides a good representation of the magnitude of warping prevented by the Ni layer.

It should be noted that the addition of a Ni layer having certain thicknesses can cause the base to warp in a direction opposite to that experienced with no Ni layer. For example, when a continuous 100 μm Ni layer is applied to the base, a reduction value of −159.5 percent is obtained. Therefore, if for example, the base without a Ni layer warps to be concave, e.g., relative to a given flat surface, then the addition of a 100 μm Ni layer would render it convex relative to the same flat surface. This situation is further illustrated in FIG. 11.

Figure 8:
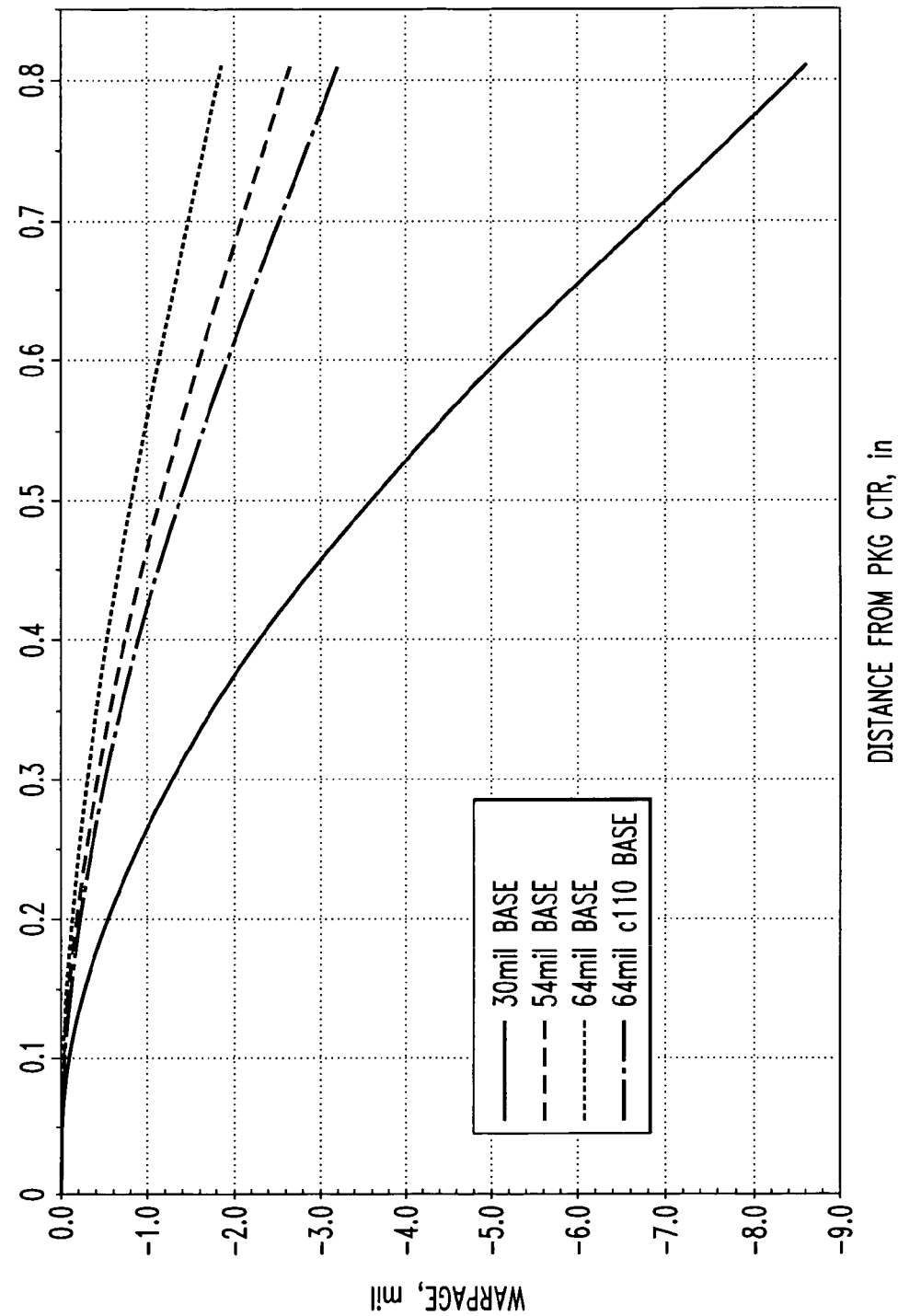
FIG. 8 is a graph illustrating warping of copper (Cu) alloy bases of various thicknesses, each having a ten μm thick counterbalancing layer comprising Ni.

The graph in FIG. 8 illustrates warping of Cu alloy bases of various thicknesses, each having a ten μm thick counterbalancing layer comprising Ni. The Cu alloy used, C151, comprises about 99.9 percent by weight Cu and about 0.1 percent by weight zirconium (Zr), based on the total weight of the alloy (referred to hereinafter as "C151"). Cu alloy C110, comprising greater than or equal to about 99.9 percent by weight Cu and less than or equal to about 0.05 percent oxygen (O), based on the total weight of the alloy (referred to hereinafter as "C110"), is included for comparison purposes.

In the graph, warping is measured as a function of the distance from the center of the package, e.g., from the center of the base. The graph illustrates that the thicker the base employed, the less the amount of warping that occurs. Therefore, some amount of warping may be prevented simply by varying the thickness of the base. However, the thickness of the base is constrained by the desired overall height of the device, which is typically required to be suitable for integration into small spaces. Therefore, the overall height of the device is generally not sufficient to accommodate a base thick enough to, on its own, substantially eliminate warping of the device.

Further, the C110 base exhibits a greater amount of warping, as compared to the C151 base of the same thickness. Therefore, some amount of warping may also be prevented by selecting different base compositions. See, for example, FIG. 9, below.

As the heading of the graph in FIG. 8 indicates, the ten μm Ni layer on the bottom of the base (for example, on a side of the base opposite, e.g., a Si die or Si dies) is considered an "extra" Ni layer, as a small amount of Ni may be already present on the base. Specifically, small amounts of Ni and Au are typically plated on the base to enhance solderability (e.g., the Ni prevents, for example, Cu from the base from diffusing through the Au and affecting the solder). This amount of nickel already plated on the base is negligible with regard to controlling warping of the device. Au is used to promote solder wetting and enhance solderability. The amount of Au already plated on the base is likewise also negligible with regard to controlling warping of the device.

Figure 9:
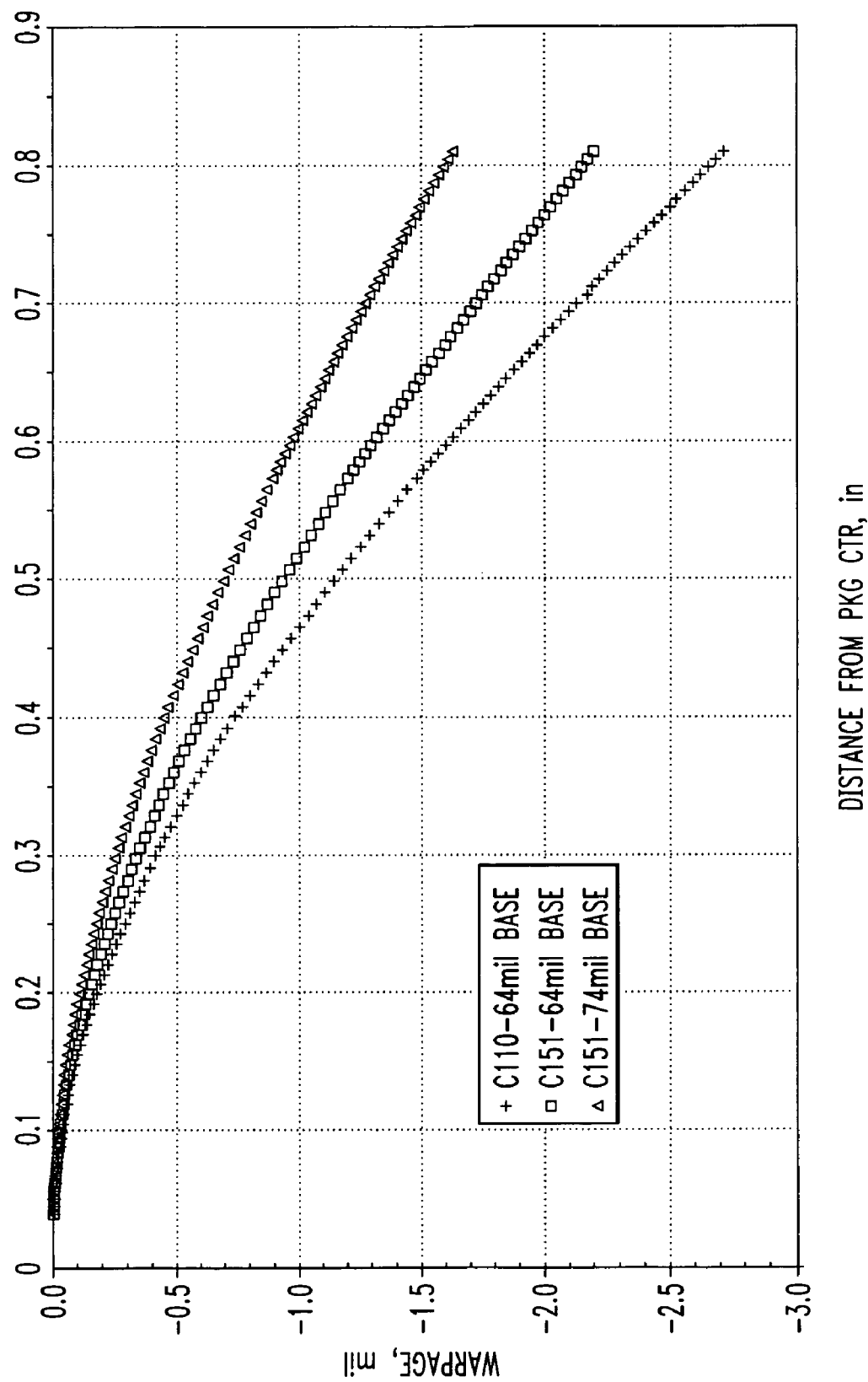
FIG. 9 is a graph illustrating warping of Cu alloy bases having different compositions and various thicknesses.

FIG. 9 is a graph illustrating the amount of warping experienced by different Cu alloy bases of different thicknesses during solder attachment of a Si die. No counterbalancing layer is present in any of the samples.

As mentioned, for example, in conjunction with the description of FIG. 8, above, the graph in FIG. 9 illustrates that some amount of warping may be prevented by selecting different base compositions. Specifically, the graph in FIG. 9 shows that when comparing Cu alloy bases of the same thickness, e.g., 64 mils, the base comprising C110 warps more than the base comprising C151. Increasing the thickness of the base comprising C151, e.g., to 74 mil, further decreases the amount of warping experienced.

Figure 10:
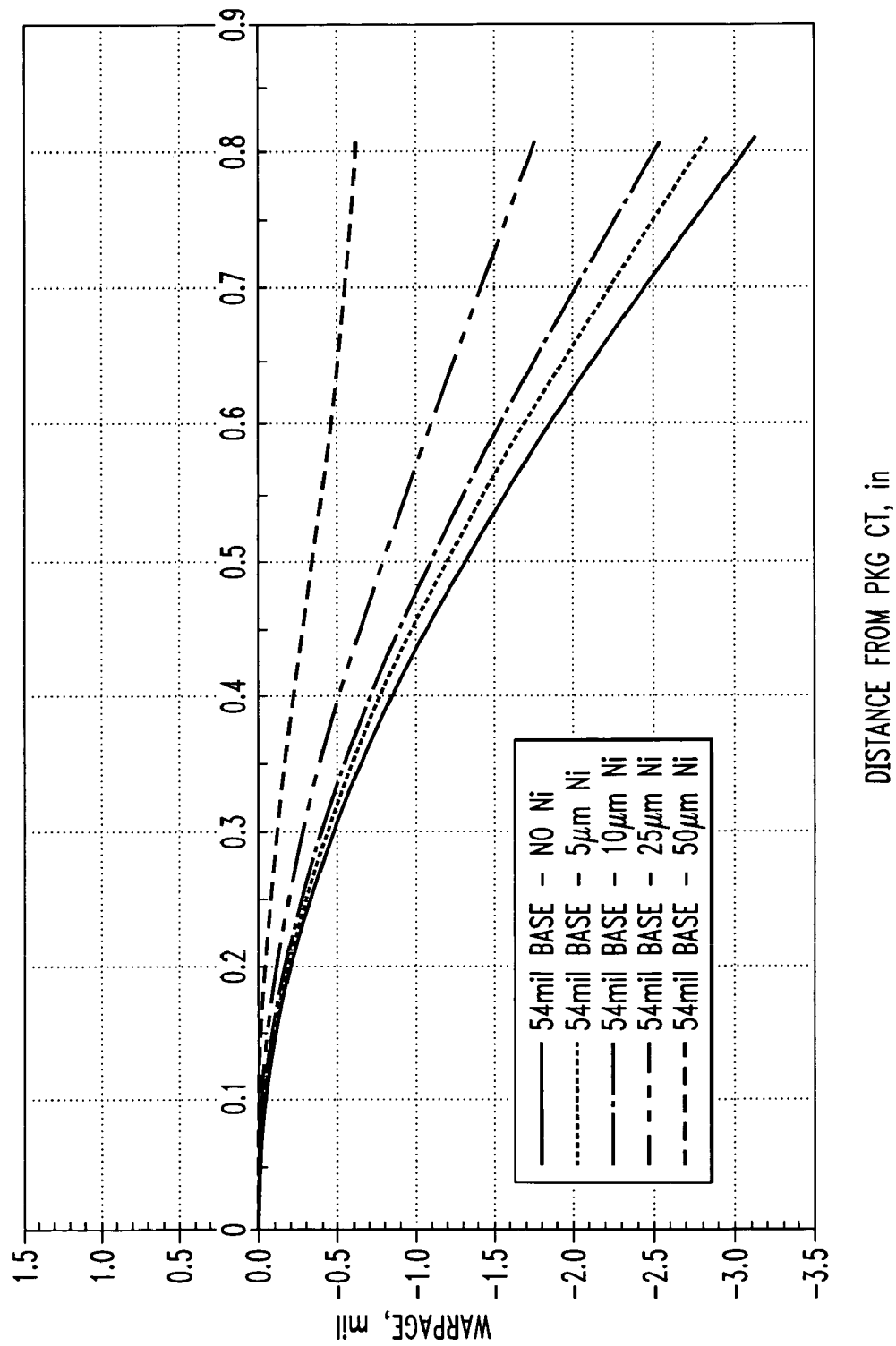
FIG. 10 is a graph illustrating warping of 54 mil thick Cu alloy bases having either counterbalancing layers of various thicknesses, or no counterbalancing layer at all.

FIG. 10 is a graph illustrating that when a continuous counterbalancing layer comprising Ni is present, the thicker the counterbalancing layer, the less warping that occurs. The same base without a counterbalancing layer is included for comparison.

The base comprises C151 which experiences a lesser amount of warping as compared with a base of the same thickness comprising C110, as described in conjunction with the description of FIG. 9, above. The base is contained in a plastic cavity package. Warping of the base occurs as a result of the process used to attach dies to the base, described above.

Figure 11:
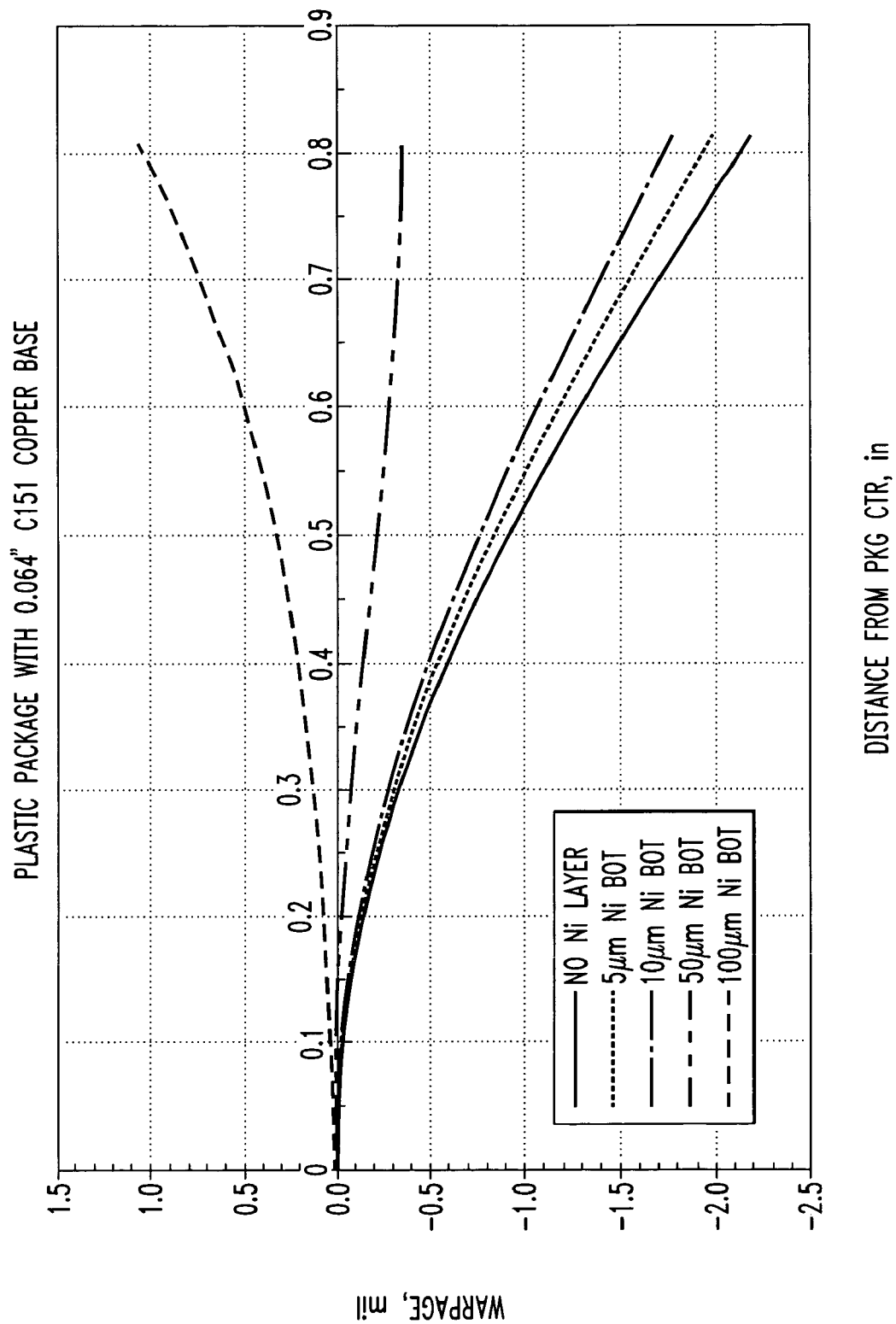
FIG. 11 is a graph illustrating warping of 64 mil thick Cu alloy bases having either counterbalancing layers of various thicknesses, or no counterbalancing layer at all.

FIG. 11 is a graph illustrating that when a continuous counterbalancing layer comprising Ni is present, the thicker the counterbalancing layer, the less warping that occurs. In fact, the graph illustrates that when the Ni layer has a thickness of 100 μm, as described above, the Cu alloy base will in fact warp inversely, as compared to a base without a Ni layer. The designation "Ni bot" indicates that the counterbalancing layer comprising Ni is on the bottom of the Cu alloy base, e.g., on a side opposite the die(s).

As in FIG. 10, described above, the base comprises C151. Also as described above, the base is contained in a plastic cavity package. Warping of the base occurs as a result of the process used to attach one or more dies to the base.

In comparison with the 54 mil thick bases of FIG. 10 having counterbalancing layers of the same thickness, the 64 mil thick bases having a five μm and a ten μm Ni layer, experience less warping. However, as highlighted above, the thickness of the base is constrained by the desired overall height of the device Therefore, the addition of a counterbalancing layer can counteract at least a portion of warping experienced in power transistor devices occurring as a result of heat being generated during certain attachment processes, e.g., during soldering. Further, properties, e.g., thickness and composition, of the counterbalancing layer, as well as, of the components of the device, can be varied to adjust warp compensation.

Further, while the instant description highlights power transistor devices comprising particular materials and having particular configurations, it is to be understood that the present teachings may be applied to a wide variety of other integrated circuit devices comprising other materials and having other configurations. Specifically, the present techniques may be applied to any integrated circuit device that experiences differential thermal expansion and contraction. By way of example only, the present techniques would be applicable to an integrated circuit device that experiences differential thermal expansion and contraction as a result of heat generated during operation.

At least a portion of the techniques of the present invention described herein may be implemented in an integrated circuit. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein, it is to be understood that the invention is not limited to those precise embodiments, and that various other changes and modifications may be made by one skilled in the art without departing from the scope of the invention as set forth in the appended claims.

What is claimed is:

1. An integrated circuit device comprising:
   a base;
   at least one die attached to the base; and
   a counterbalancing layer on at least a portion of at least one side of the base adapted to compensate for at least a portion of a thermal expansion difference existing between the base and the die, wherein said counterbalancing layer comprises at least one metal.

2. The device of claim 1, comprising a power transistor device.

3. The device of claim 1, wherein the thermal expansion difference occurs as a result of heat generated during attachment of the die to the base.

4. The device of claim 1, wherein the die is attached to the base by soldering.

5. The device of claim 1, wherein the thermal expansion difference between the base and the die is due, at least in part, to the base having a different coefficient of thermal expansion from the die.

6. The device of claim 1, wherein the die comprises one or more of silicon, indium phosphide, indium gallium phosphide, indium gallium arsenide phosphide, gallium arsenide, silicon carbide, silica germanium, indium tin oxide, black diamond, crystallized carbon, polymeric semiconductor and lithium niobate.

7. The device of claim 1, wherein the base comprises one or more metals.

8. The device of claim 1, wherein the base comprises one or more of copper and alloys thereof.

9. The device of claim 1, wherein the counterbalancing layer comprises one or more of nickel and gold.

10. The device of claim 1, wherein the counterbalancing layer is segmented, having indentations on at least one surface thereof.

11. The device of claim 1, wherein the counterbalancing layer is segmented, having perforations extending through the entire thickness of the layer, the length of each segment running parallel with a direction of warping.

12. The device of claim 1, wherein the counterbalancing layer comprises a hatched layer.

13. The device of claim 1, wherein the counterbalancing layer is applied as a continuous layer extending substantially over at least one side of the base.

14. The device of claim 1, wherein the counterbalancing layer is applied to a side of the base opposite the die.

15. The device of claim 1, wherein the counterbalancing layer has a thickness of about five micrometers to about 100 micrometers.

16. A method of controlling warping of a power transistor device comprising at least one die attached to a base, the method comprising the step of:
   applying a counterbalancing layer to at least a portion of at least one side of the base adapted to compensate for at least a portion of a thermal expansion difference existing between the base and the die, wherein said counterbalancing layer comprises at least one metal.

* * * * *